(12) United States Patent
Mizutani

(10) Patent No.: US 6,603,557 B2
(45) Date of Patent: Aug. 5, 2003

(54) RING LASER GYRO HAVING RING RESONATOR SEMICONDUCTOR LASERS AND DRIVING METHOD THEREOF

(75) Inventor: Natsuhiko Mizutani, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/901,040

(22) Filed: Jul. 10, 2001

(65) Prior Publication Data

US 2002/0030822 A1 Mar. 14, 2002

(30) Foreign Application Priority Data

Jul. 12, 2000 (JP) .................................. 2000-211855

(51) Int. Cl.[7] .............................................. G01C 19/64
(52) U.S. Cl. .................................. 356/459; 250/231.12
(58) Field of Search ................................ 356/459, 461, 356/463; 372/94; 250/231.13, 231.12

(56) References Cited

U.S. PATENT DOCUMENTS

| 4,431,308 A | 2/1984 | Mitsuhashi et al. .......... 356/350 |
| 4,913,548 A | 4/1990 | Vick ........................... 356/350 |
| 5,764,681 A | 6/1998 | Ballantyne et al. ........... 372/94 |
| 6,304,329 B1 * | 10/2001 | Nitta et al. .................. 356/459 |
| 6,448,552 B1 * | 9/2002 | Mizutani et al. ....... 250/231.12 |

FOREIGN PATENT DOCUMENTS

| JP | 57-43486 | 3/1982 |
| JP | 4-174317 | 6/1992 |
| JP | 6-38529 | 5/1994 |

* cited by examiner

*Primary Examiner*—Que T. Le
(74) *Attorney, Agent, or Firm*—Fitzpatrick, Cella, Harper & Scinto

(57) ABSTRACT

A ring laser gyro includes a tapered portion in a part of an optical waveguide, a plurality of ring resonator semiconductor lasers optically independent of each other on a common plane, and a plurality of electric terminals for detecting a change in the impedances of said ring resonator semiconductor lasers. The tapered portion includes a first portion where a width of the optical waveguide is gradually widened along a direction of propagating a laser beam clockwise and a second portion where the width of the optical waveguide is gradually narrowed along the direction, and further comprising a first ring resonator semiconductor layer in which said first portion is longer than the second portion, and a second ring resonator semiconductor layer in which said second portion is longer than the first portion.

11 Claims, 6 Drawing Sheets

US 6,603,557 B2

RING LASER GYRO HAVING RING RESONATOR SEMICONDUCTOR LASERS AND DRIVING METHOD THEREOF

BACKGROUND OF THE INVENTION

1. Field of the Invention

The present invention relates to a ring laser gyro that detects an angular velocity of a rotary motion by using a semiconductor ring laser, and more particularly to a ring laser gyro that is capable of detecting a direction of rotation.

2. Related Background Art

Up to now, as a gyro that detects the rotation, that is, the angular velocity of an object, there have been known a mechanical gyro having a rotor and a vibrator, and an optical gyro. Because the optical gyro enables instantaneous activation and is wide in dynamic range, it is increasingly innovative in the gyro field. The optical gyro is classified into a ring laser gyro, an optical fiber gyro, a passive ring resonator gyro, and the like. The ring laser gyro using a gas laser has already been put into practical use, such as in an aircraft. Also, as the ring laser gyro which is small in size and high in precision, there has been proposed a gyro formed of a ring resonator semiconductor laser on a semiconductor substrate, which is disclosed in Japanese Patent Publication No. 62-39836, Japanese Patent Application Laid-open No. 4-174317, and Japanese Patent Publication No. 6-38529.

The gyro formed of the ring resonator semiconductor laser has features that it can reduce the element size, lessen the power consumption, and shorten a start time as compared with the mechanical gyro having the vibrator. Therefore, the gyro of this type is properly used for a vibration absorption control device that prevents a photographing error due to hand vibrations in a still camera or a video camera.

A beat frequency detected from the gyro has information on an angular velocity. In order to detect the beat frequency, there are a method of converting the vibration frequency of a beat signal into a voltage signal by a frequency-to-voltage converting circuit, a method of directly detecting the beat frequency by a frequency counter, and other methods.

However, the conventional gyro formed of the ring resonator semiconductor laser has not been so designed as to detect the beat signal in a short period of time.

SUMMARY OF THE INVENTION

According to one aspect of the present invention, there is provided a ring laser gyro, comprising a plurality of ring resonator semiconductor lasers optically independent of each other, said plurality of ring resonator semiconductor lasers including at least one pair, wherein, for the at least one pair, changes in beat frequency increases and decreases are opposite to each other with respect to one directional rotation.

According to another aspect of the present invention, there is provided a ring laser gyro that changes a cycle of impedance fluctuation between terminals in accordance with an applied angular velocity, has a plurality of ring resonator semiconductor lasers optically independent of each other on a common plane and has a plurality of electric terminals that detect the impedance fluctuation, said ring laser gyro comprising: a first ring resonator semiconductor laser that shortens a cycle of the impedance fluctuation as an angular velocity in a certain direction increases; and a second ring resonator semiconductor laser that lengthens the cycle of the impedance fluctuation as the angular velocity increases.

According to the above structures, since the ring resonator semiconductor lasers are optically independent of each other, even in the case where the gyro rotates in any direction, the cycle of the impedance fluctuation from any ring resonator semiconductor laser is shortened. Also, the impedance fluctuations in both of the ring resonator semiconductor lasers are taken in a signal processing circuit as a cyclic fluctuation of the terminal voltage, and the angular velocity is detected on the basis of a signal whose cycle is reduced, to thereby conduct signal processing on the basis of a signal shorter in cycle than the beat frequency in a stationary state. Also, the direction of rotation is found by detecting and comparing whether the cycle of the signal is reduced in any ring resonator semiconductor laser as compared with that in the stationary state, or not.

Further, according to still another aspect of the present invention, there is provided a ring laser gyro that includes a tapered portion in a part of an optical waveguide, a plurality of ring resonator semiconductor lasers optically independent of each other on a common plane, and a plurality of electric terminals for detecting a change in the impedances of said ring resonator semiconductor lasers, wherein said tapered portion includes a first portion where a width of the optical waveguide is gradually widened along a direction of propagating a laser beam clockwise and a second portion where the width of the optical waveguide is gradually narrowed along the direction, and further comprising a first ring resonator semiconductor laser in which said first portion is longer than said second portion, and a second ring resonator semiconductor laser in which said second portion is longer than said first portion.

The tapered shape of the ring resonator semiconductor laser makes the oscillation frequency of the laser mode in the stationary state different between a clockwise mode and a counterclockwise mode. That is, the waveguide light is propagated while repeating total reflection and in the tapered portion, since an incident angle of the total reflection changes, a difference occurs in the loss with the result that the loss of the resonator depends on an orbiting direction. Because a difference occurs in the loss of the resonator due to the orbiting direction of the laser beam, a difference occurs in the oscillation threshold value of the ring laser, and in a state where two modes exist together and the laser oscillates, a difference occurs in the density of photons of those two modes. Since the density of photons is different, a difference occurs in the oscillation frequency of the laser mode. In addition, in the above tapered shape, the lengths of the first portion and the second portion are reversed between the first and second ring resonator semiconductor lasers. With this structure, the sizes of the oscillation frequencies of the clockwise laser mode and the counterclockwise laser mode are reversed between the first and second ring resonator semiconductor lasers. Thus, an increase/decrease in the cycle of the impedance fluctuation when the angular velocity increases in a certain direction is reversed between the first and second ring resonator semiconductor lasers. Since the ring resonator semiconductor lasers are optically independent of each other, even in the case where the optical gyro is rotated in any direction, the cycle of the impedance fluctuation from any one of the ring resonator semiconductor lasers is shortened. The impedance fluctuation in both of the ring resonator semiconductor lasers is taken in the signal processing circuit as a cyclic fluctuation of the terminal voltage, and the angular velocity is detected on the basis of a signal whose cycle is reduced, to conduct signal processing on the basis of a signal shorter in cycle than that of the beat frequency in the stationary state, thereby making it possible to detect the angular velocity. Also, the direction of rotation is found by detecting and comparing whether the cycle of the signal is reduced in any ring resonator semiconductor laser as compared with that in the stationary state, or not.

According to yet still another object of the present invention, there is provided a ring laser gyro further comprising an absorber or a light shield body between the ring resonator semiconductor lasers, thereby making it possible to prevent optical coupling of an adjacent element that prevents the operation of the ring resonator semiconductor laser with the semiconductor laser.

According to yet still another object of the present invention, there is provided a ring laser gyro in which the shapes of the ring resonators of two ring resonator semiconductor lasers have a mirror image relationship. In those two ring resonator semiconductor lasers, the peripheral lengths and the surrounding areas of the ring resonators are equal to each other, and the shapes of the tapered portion have a mirror image relation. Therefore, a frequency difference between the laser beam clockwise in the stationary state and the counterclockwise laser beam are equal to each other in absolute value, but signs are reversed. In other words, in those two ring resonator lasers, the beat frequencies in the stationary state are substantially equal to each other under the same drive condition.

Since the peripheral lengths and the surrounding areas of the ring resonators are equal to each other, the fluctuations of the beat frequencies with respect to the angular velocity in the two ring resonator semiconductor lasers are equal to each other in absolute value and reversed in sign. Therefore, in the case where the driving conditions of those two elements are identical, the direction of rotation can be detected only by comparing the signals from the above two ring resonator semiconductor lasers with each other.

According to yet still another aspect of the present invention, there is provided a method of processing a signal in a ring laser gyro, in which the cycles of the impedance fluctuations between the terminals of the plurality of ring resonator semiconductor lasers are compared with each other, and an angular velocity and a direction of rotation are obtained on the basis of a signal from an element whose cycle is shorter.

Alternatively, the cycles of the impedance fluctuations between the terminals of the plurality of ring resonator semiconductor lasers are compared with the periods of the impedance fluctuations in the stationary state, respectively, and the angular velocity and the direction of rotation are obtained on the basis of the signal from the element whose cycle is reduced.

According to this structure, the cycles of the signals that represent the impedance changes between the plurality of ring resonator semiconductor lasers are detected by the signal processing circuit, respectively, and the cycle per se of the fluctuation or a difference to the fluctuation period and the stationary time is obtained.

The element whose cycle is shorter or whose period is reduced indicates the direction of rotation of the gyro, and the absolute value of the angular velocity can be detected on the basis of that signal. In this situation, the band of the signal processing can be set to only a high-frequency side from the period of the beat in the stationary state. In this case, a signal from an element whose cycle is longer is out of the signal processing band, but if the fact that the cycle becomes longer is found, there is no problem in an accuracy in the detection and a final output is not adversely affected. Also, since the beat frequency from the gyro is higher than the beat frequency in the stationary state, a response time of the gyro can be lengthened up to the inverse of the beat frequency in the stationary state.

DETAILED DESCRIPTION OF THE PREFERRED EMBODIMENTS

Now, a description will be given in more detail of preferred embodiments of the present invention with reference to the accompanying drawings.

(First Embodiment)

Figure 1A:
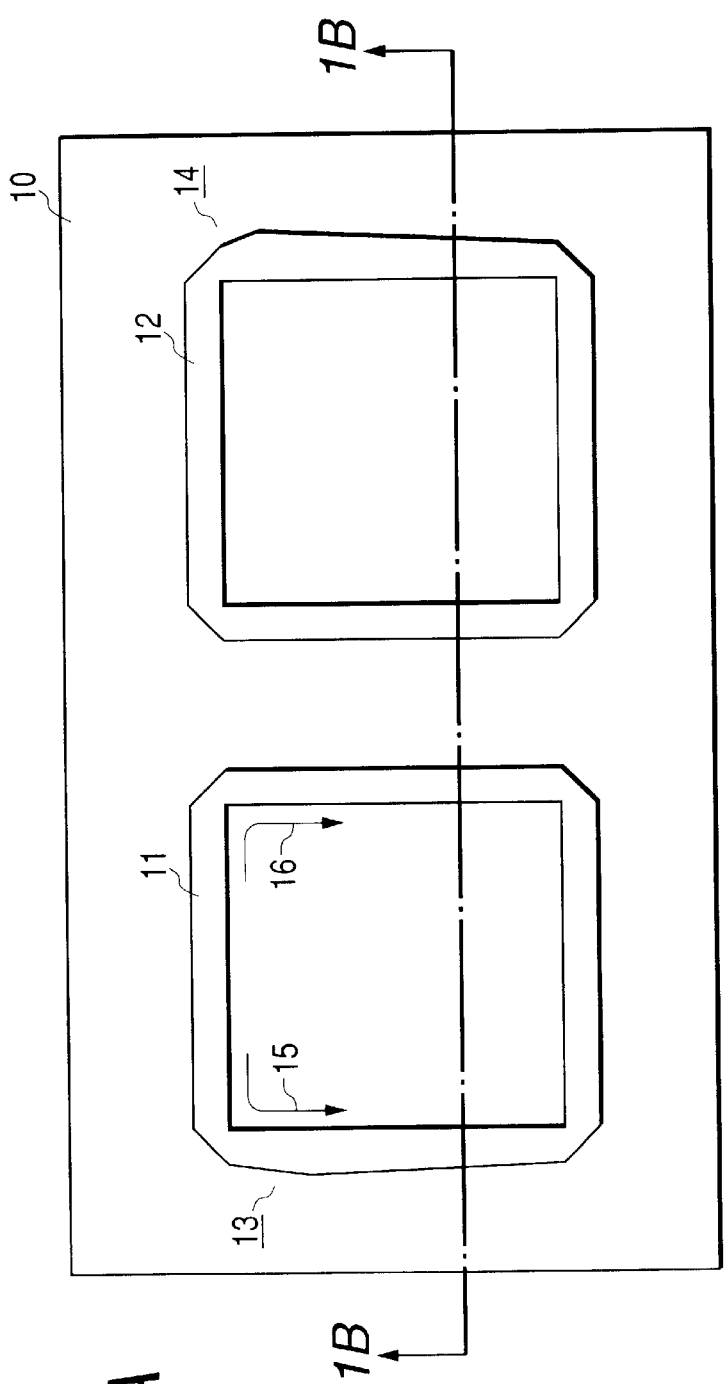
FIGS. 1A and 1B are diagrams showing a ring laser gyro in accordance with a first embodiment of the present invention.
Figure 1B:
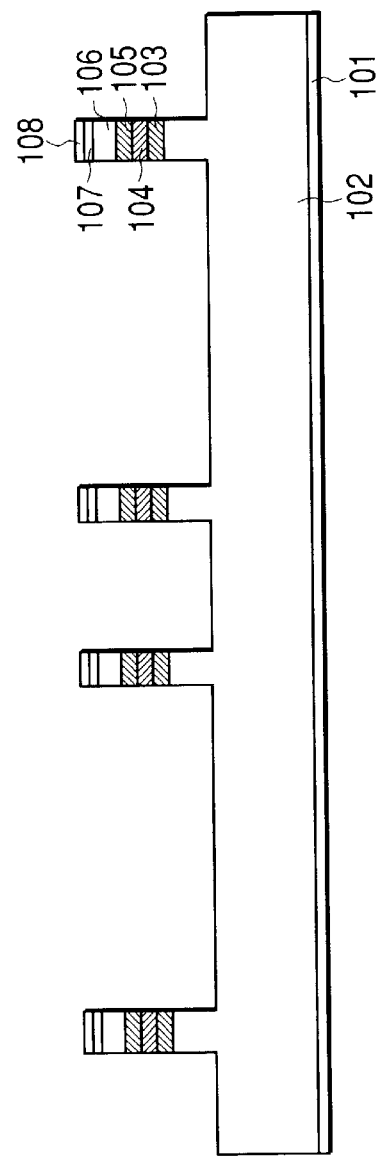

FIG. 1A is a plan view showing an optical gyro in accordance with a first embodiment, and FIG. 1B is a cross-sectional view taken along a line 1B—1B of FIG. 1A. Reference numeral 10 denotes an optical gyro element according to the present invention, numerals 11 and 12 indicate ring resonator semiconductor laser elements, respectively, and numerals 13 and 14 indicate portions each of which changes a waveguide width disposed in a part of a waveguide (hereinafter referred to as "tapered portion"). In the ring resonator semiconductor laser element, there exist a counterclockwise circumferential mode indicated by reference numeral 15 and a clockwise circumferential mode indicated by reference numeral 16.

Those two ring resonator semiconductor laser elements 11 and 12 are manufactured in the following manner. First, a semiconductor multi-layer structure shown in a cross-sectional view of the element of FIGS. 1A and 1B is formed through an organic metal gas-phase growing method. That is, on an n-InP substrate 102, an undoped InGaAsP optical guiding layer 103 with a band gap wavelength of 1.3 $\mu$m (0.15 $\mu$m in thickness), an undoped InGaAsP active layer 104 with a band gap wavelength of 1.55 $\mu$m (0.1 $\mu$m in thickness), an undoped InGaAsP optical guiding layer 105 with a band gap wavelength of 1.3 $\mu$m (0.15 $\mu$m in thickness), a p-InP cladding layer 106 (1.5 $\mu$m) and a p-InGaAs cap layer 107 are subjected to crystal growth. A photoresist is coated, and a mask pattern is exposed and developed to form a ring resonator shaped resist pattern.

A ring laser formed of high-same shaped ridge waveguide 3 $\mu$m in height is formed through a reactive ion etching using a chlorine gas. Cr/Au is vacuum-evaporated on an upper portion of the ridge waveguide into a p-electrode 108. AuGe/Ni/Au is vacuum-evaporated on a lower side of a wafer into an n-electrode 101. The p- and n-electrodes are alloylized in a hydrogen atmosphere so that p- and n-electrodes are brought in ohmic contact with each other.

The shape of the waveguide that forms the ring waveguide will be described in more detail below. A ring laser 11 and a ring laser 12 are asymmetrically shaped, respectively. In other words, the tapered portion 13 (and 14) is made up of a first portion in which the width of the optical waveguide is gradually widened along a direction of propagating a laser beam counterclockwise (clockwise), and a second portion in which the width of the optical waveguide is gradually narrowed. The first portion and the second portion are different in length from each other. In particular, in the example shown in the figure, the first portion is extremely shortened. In addition, in this embodiment, the resonators of the ring laser 11 and the ring laser 12 are shaped into mutual mirror images. A difference in the oscillation frequency between the laser beam clockwise and the laser beam counterclockwise can be appropriately set, but normally set to be 100 Hz or more, preferably 1 KHz or more, and more preferably 10 KHz or more.

In the arrangement of the ring laser 11 and the ring laser 12 formed on the same substrate, those ring lasers 11 and 12 are spaced from each other so as not to couple the laser beams from the respective ring lasers 11 and 12 with each other. In order to avoid the influence of evanescent light, they are spaced from each other by about 15 μm or more. Also, in the asymmetric tapered portion, since there exists a laser beam that is irradiated to the exterior of the waveguide with the mode conversion, the tapered portions are so designed as to be prevented from facing each other or existing on the same axis. Also, an absorber resulting from making the semiconductor layer remain without being etched may be formed between the respective ring lasers. Also, an insulating film and an electrode metal may be formed as a light shield member on the side surface and the upper surface of this absorber. Also, a light shield member may be formed by an insulating film formed on the element side surface and an electrode metal formed on the insulating film. The light shield member may be arranged with an incline so that a light reflected from the light shield member surface is not returned to the ring resonator semiconductor laser. The interaction between those ring lasers can be reduced by the element arrangement, the absorber and the light shield member described above.

Figure 2:
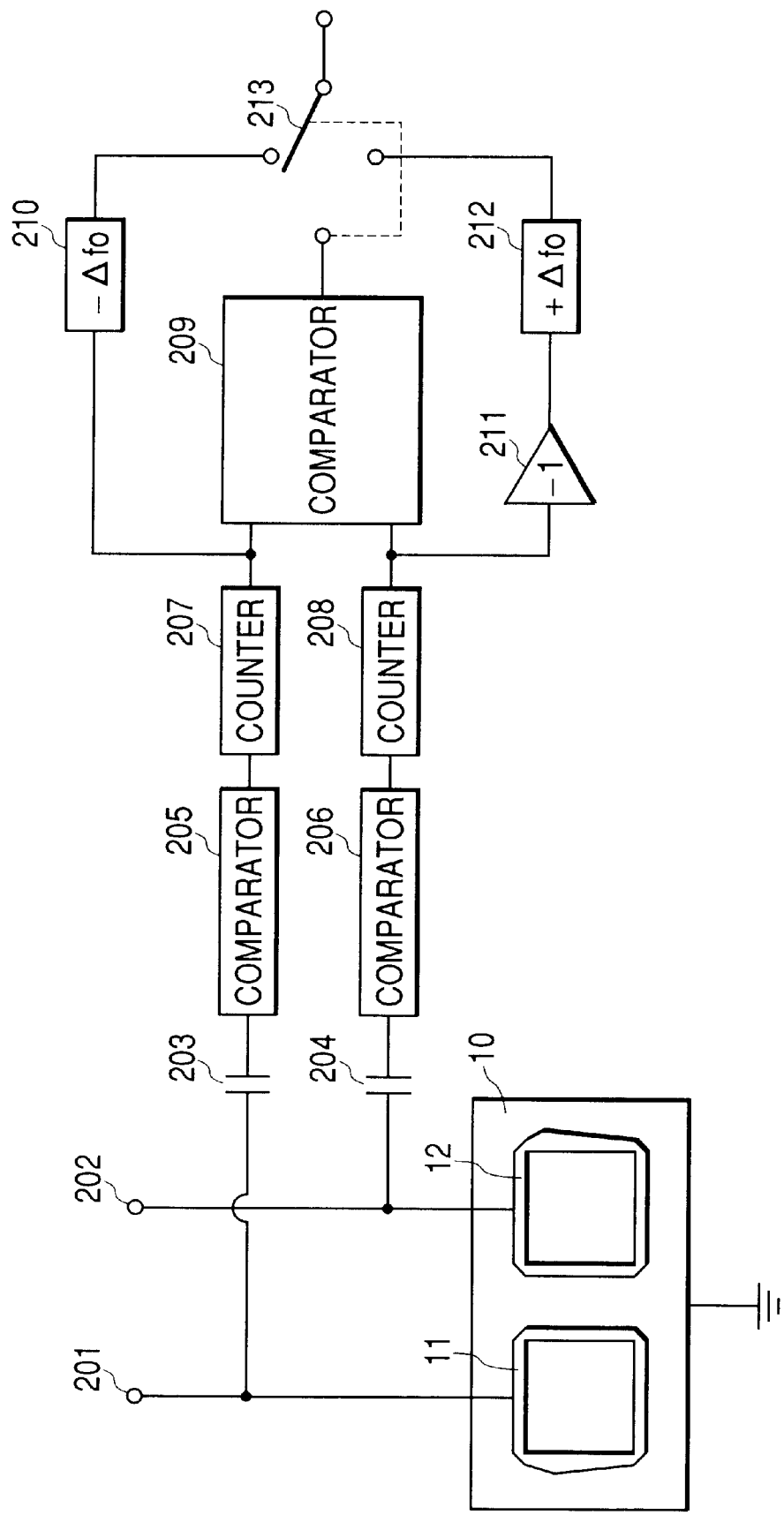
FIG. 2 is a diagram showing the ring laser gyro, a drive circuit and a signal processing circuit in accordance with the first embodiment of the present invention.

In order to detect a current injection and a terminal voltage, a circuit shown in FIG. 2 is used in each of the ring laser 11 and the ring laser 12, independently.

Referring to FIG. 2, reference numeral 10 denotes an optical gyro element according to the present invention, numerals 11 and 12 indicate ring resonator semiconductor elements, numerals 201 and 202 indicate drive current input terminals, numerals 203 and 204 indicate coupling capacitors, numerals 205, 206 and 207 indicate comparators, numerals 207 and 208 indicate counters, numerals 210 and 212 indicate offset circuits, numeral 211 indicates an invertor of a gain–1, and numeral 213 indicates an output terminal.

The terminals 201 and 202 are connected to a power supply, respectively, and driven with a constant current when the supply current is an oscillation threshold current of the laser or more. In the supply current of the oscillation threshold value or more, a clockwise circumferential mode and a counterclockwise circumferential mode exist in the ring laser 11 (and 12) as the laser mode, independently.

The clockwise laser beam and the counterclockwise laser beam are different in oscillation frequency from each other. This is caused by the action of the asymmetric tapered portion of the ring resonator semiconductor laser 11 (and 12) as will be described later. The laser beam is propagated while repeating total reflection on the optical waveguide interface. In the tapered portion, since an incident angle of the laser beam to the optical waveguide interface changes, a waveguide loss occurs. Since the incident angle at the tapered portion is different, a difference in the loss occurs with the result that the loss of the resonator depends on the circumferential direction.

Because a difference occurs in the resonator loss depending on the circumferential direction of the laser beam, a difference occurs in the oscillation threshold value of the ring laser, and in a state where two modes oscillate while existing together, a difference occurs in the density of photons of those two modes. The oscillation frequencies $f_j$ and the densities of photons $S_j$ of those two modes that exist together have the following relationship. It is understandable that if a difference occurs in the density of photons, a difference occurs in the oscillation frequency.

$$2\pi f_1 + d\Phi_1/dt = \Omega + \sigma_1 - \rho_1 S_1 \tau_{12} S_2$$
$$2\pi f_2 + d\Phi_2/dt = \Omega + \sigma_2 - \rho_2 S_2 \tau_{21} S_1 \quad (1)$$

where Fi is a phase, $\Omega$ is a resonance angle frequency, $\sigma_i$ is a mode pulling coefficient, $\rho_i$ is a self-mode-pushing coefficient, and $\tau_{ij}$ is a cross-mode-pushing coefficient, in which i, j=1, 2; i≠j. Since the oscillation frequencies $f_{10}$ and $f_{20}$ are different from each other in the stationary state, a beat occurs at a frequency of $\Delta f_0 = f_{20} - f_{10}$.

In this example, when the semiconductor laser gyro rotates clockwise at an angular velocity $\Omega$, the oscillation frequency of the first laser beam clockwise is reduced by a value represented by the following expression (2) as compared with the oscillation frequency $f_{10}$ during non-rotation.

$$\Delta f_1 = 2S\Omega/(\lambda_1 L) \quad (2)$$

where S is an area surrounded by the ring resonator, L is an optical path length, and $\lambda_i$ is a wavelength of the interior of a medium of the laser.

At the same time, the oscillation frequency of the second laser beam counterclockwise is increased by a value represented by the following expression (3) as compared with the oscillation frequency $f_{20}$ during non-rotation.

$$\Delta f_2 = 2S\Omega/(\lambda_2 L) \quad (3)$$

In the laser resonator, since the first laser beam and the second laser beam exist together, a beat occurs at the frequency of a difference between the oscillation frequency $f_1$ of the first laser beam and the oscillation frequency $f_2$ of the second laser beam. The frequency $\Delta f$ during rotation is represented by the following expression (4).

$$\Delta f = f_2 - f_1 = f_{20} - f_{10} + (\Delta f_2 + \Delta f_1) = f_{20} - f_{10} + (2S\Omega/L) \cdot (1/\lambda_2 + 1/\lambda_1) \quad (4)$$

The beat of the laser beam induces a population pulsation of a population inversion at the same frequency $\Delta f$, to thereby change an impedance between the terminals. Therefore, in case of a constant current drive, a voltage fluctuation at the above frequency of $\Delta f$ is observed at the voltage between the terminals. Since the observable frequency is always positive, $|\Delta f|$ is obtained.

Figure 3:
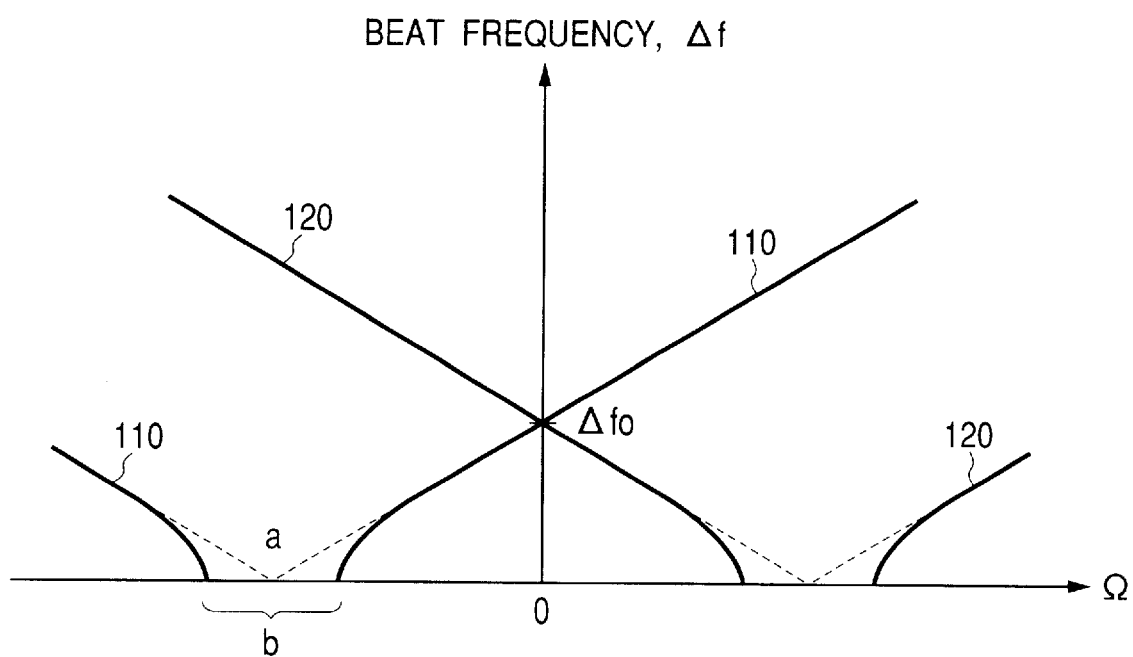
FIG. 3 is a graph showing a frequency and an angular velocity of a beat signal of the ring laser gyro in accordance with the first embodiment of the present invention.

As described above, if the oscillation frequency $f_{10}$ and the oscillation frequency $f_{20}$ in the laser mode during the stationary state are different from each other, the beat frequency of $\Delta f_0=(f_{20}-f_{10})$ is selected in the stationary state as shown in FIG. 3, and the beat frequency increases or decreases in accordance with the direction of rotation during rotation as shown by a straight line portion of FIG. 3.

In FIG. 3, a signal of the ring laser where $f_{20}-f_{10}>0$ is represented by a solid line 110. Also, a signal of the ring laser where $f_{20}-f_{10}<0$ is represented by a solid line 120.

A relationship between the frequency and the angular velocity of a voltage signal thus obtained from the ring laser will be described below with reference to FIG. 3.

A straight line portion denoted by reference numeral 110 and a broken line a extending from the straight line is $\Delta f$ represented by the expression (4). If a difference in the oscillation frequency between the two modes is equal to or smaller than a certain threshold value (broken line portion), those two modes have a strong coupling state, and the laser oscillation of the two modes may not be performed independently of each other. In this situation, the beat of the light and the cyclic fluctuation of a voltage cannot be observed (region b).

Subsequently, a description will be given of a method of processing a signal from the ring lasers 11 and 12 having the tapered waveguide and being symmetrical in a mirror image fashion.

Referring to FIG. 3, in the case where the angular velocity $\Omega$ is larger than 0 ($\Omega>0$), the beat frequency 110 from the ring laser 11 is used for the signal processing. In case of $\Omega<0$, the beat frequency 120 from the ring laser 12 is used for the signal processing.

In this way, the use of the beat frequency larger than $\Delta f_0$ in the detection of the angular velocity is useful in that a measuring period of time is not longer than a period of time required for measurement of $\Delta f_0$. Also, the direction of rotation is understandable from which signal of the ring lasers 11 and 12 is used.

Hereinafter, more details will be described.

In the signal processing circuit shown in FIG. 2, the angular velocity is detected as follows. A signal of the voltage fluctuation is taken in from the respective ring resonator semiconductor lasers through the capacitors 203 and 204, and the frequency signal is shaped into a pulse by the comparators 205 and 206. The number of pulses within a given period of time is counted by the counters 207 and 208. A signal of the ring laser 11 in which $f_{20}-f_{10}>0$ is outputted from the counter 207, and a signal of the ring laser 12 in which $f_{20}-f_{10}<0$ is outputted from the counter 208, respectively. The comparator 209 compares the outputs of those two counters with each other and if the output of the counter 208 is larger, a value resulting from subtracting the number of counts corresponding to the beat in the stationary state from the output of the counter (210) is produced as an output 213. That is, a value resulting from subtracting $\Delta f_0$ from the solid line 110 in FIG. 3 is outputted. If the number of counts in the counter 208 is larger, the output of the counter 208 is multiplied by (−1) and then added with the number of counts corresponding to the beat in the stationary state (212) as an output 213. In this way, the output signal proportional to the angular velocity including a sign representative of the direction of rotation is obtained.

In the frequency detecting circuit due to the above-described pulse counting, even if the beat frequency from one of those ring lasers is lessened to reduce the number of pulses which are inputted to the counter within a given period of time, the pulses of the number larger than that in the stationary state enter another counter from the ring laser, thereby making it possible to detect an arbitrary angular velocity in a shorter sampling period of time which is the same degree as that in which the beat frequency during the stationary state is counted. Also, even in case of the angular velocity at which the beat frequency is further lessened to cause the lock-in in one of those ring lasers, since a signal from another ring laser is processed, the gyro is not adversely affected by the lock-in.

In this embodiment, InGaAsP/InP is employed as the semiconductor material, but a material such as GaAs, ZnSe or InGaN which can oscillate the laser by the injection of a current may be employed instead.

(Second Embodiment)

Figure 4:
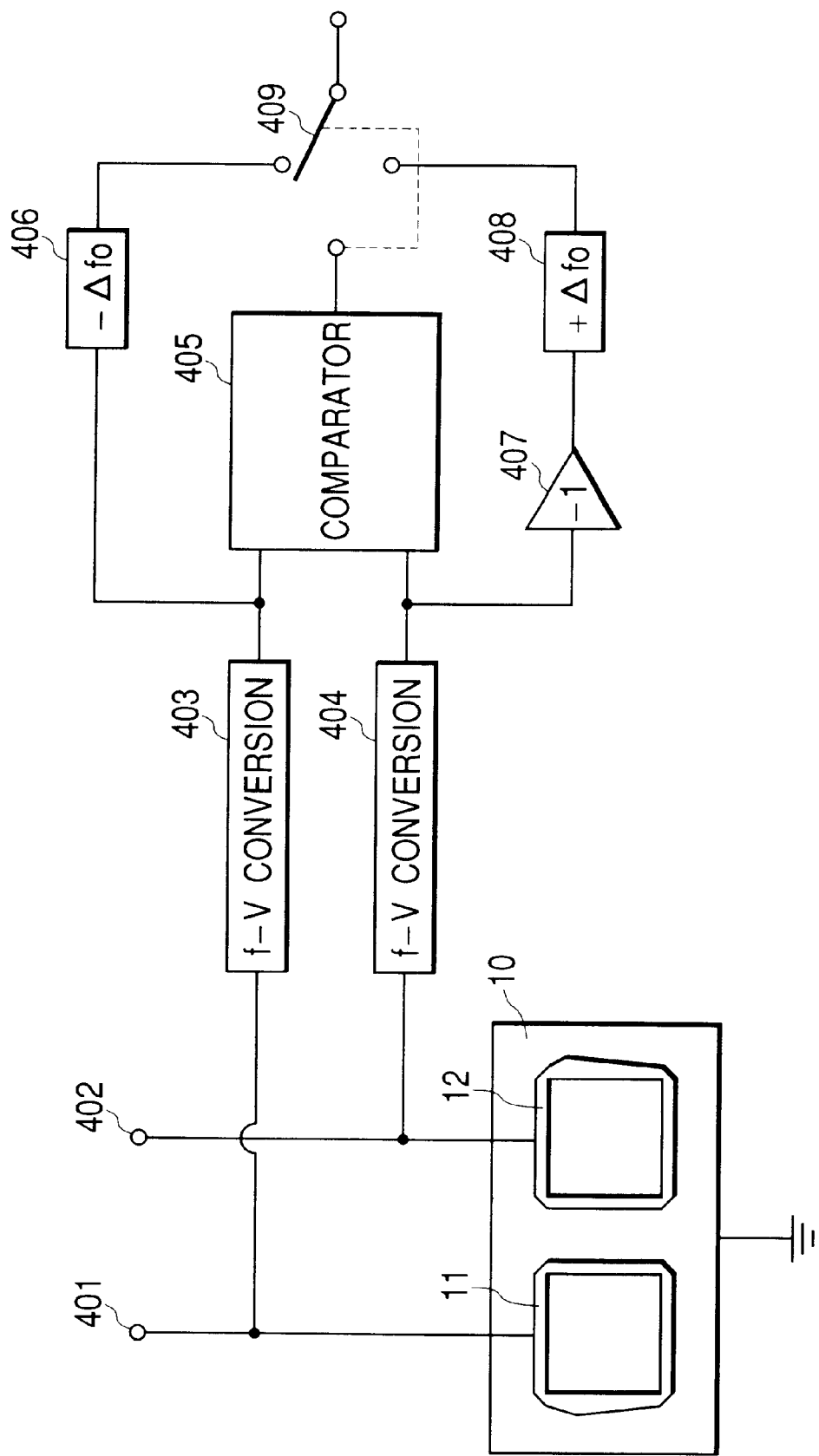
FIG. 4 is a diagram showing a signal processing circuit of a ring laser gyro in accordance with a second embodiment of the present invention.

An optical gyro according to a second embodiment of the present invention will be described with reference to FIG. 4. Reference numeral 10 denotes an optical gyro element according to the present invention, numerals 11 and 12 indicate ring resonator semiconductor laser elements, numerals 401 and 402 indicate drive current input terminals, numerals 403 and 404 indicate frequency-voltage converting circuits (f-V converting circuits), numeral 405 indicates a comparator, numerals 406 and 408 indicate offset circuits, numeral 407 indicates an invertor of the gain (−1) and numeral 409 indicates an output terminal.

The gyro element is identical in structure with that of the first embodiment. In a signal processing circuit shown in FIG. 4, an angular velocity is detected as follows. The gyro is driven due to a constant-current drive of a threshold current or more from the terminals 401 and 402 to drive the gyro, and the fluctuation of the terminal voltage is inputted directly to the f-V converting circuits 403 and 404, to thereby obtain a voltage output proportional to the beat signal frequency. The comparator 405 compares the outputs from those two f-V converting circuits with each other, and if a signal from the first f-V converting circuit 403 is larger, a signal (406) resulting from subtracting the offset corresponding to the beat $\Delta f_0$ in the stationary state from that signal is produced as an output (409). Also, if a signal from the second f-V converting circuit 404 is larger, a signal added with an offset corresponding to the beat $\Delta f_0$ in the stationary state after the sign of that signal has been inverted by the invertor 407 is produced as an output 409.

In this example, the band of the f-V converting circuits may be at the higher frequency side than the beat frequency $\Delta f_0$ in the stationary state, and the f-V converting circuit may have the characteristic that the output is rapidly lessened with respect to the lower frequency side than the beat frequency $\Delta f_0$. In other words, since an integral period of time in the f-V converting circuit can be shortened to about $1/(2p\ f_0)$, there is no necessity that a capacitor that constitutes the f-V converting circuit has a large capacitance. Also, since a response time of the f-V converting circuit becomes about the integral period of time, a response characteristic of the gyro can be improved.

(Third Embodiment)

Figure 5:
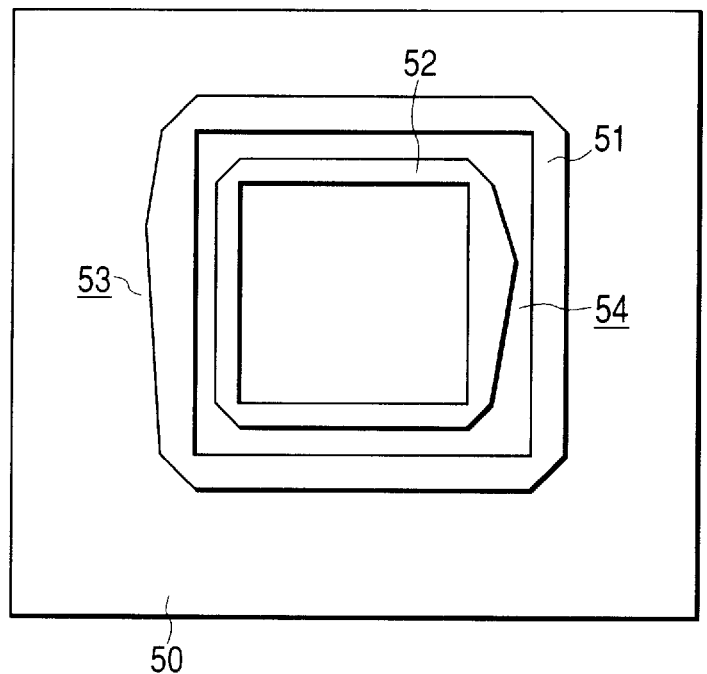
FIG. 5 is a diagram showing a ring laser gyro in accordance with a third embodiment of the present invention.

A third embodiment will be described with reference to FIG. 5. Reference numeral 50 denotes an optical gyro element according to the present invention, in which reference numerals 51 and 52 denote ring resonator semiconductor laser elements arranged in concentric circles, and numerals 53 and 54 indicate tapered portions. In the ring laser 51 and the ring laser 52, the structures of the asymmetric tapered portions are reversed as follows: That is, in the tapered portion 53 of the ring laser 51, the second portion in which the width of the optical waveguide is gradually narrowed along the direction of propagating the laser beam counterclockwise is longer than the first portion in which the width of the optical waveguide is gradually widened along the propagating direction. On the other hand, in the tapered portion 54 of the ring laser 52, the first portion in which the width of the optical waveguide is gradually widened along the direction of propagating the laser beam counterclockwise is longer than the second portion in which the width of the optical waveguide is gradually narrowed along the propagating direction. In the arrangement of the ring laser 51 and the ring laser 52 formed on the same substrate, those ring lasers 51 and 52 are spaced from each other so as not to couple the laser beams from the respective ring lasers 51 and 52 with each other as in the first embodiment. They are spaced from each other by about 15 μm or more in order to avoid the influence of evanescent light. Also, in the asymmetric tapered portion, since there exists a laser beam that is irradiated to the exterior of the waveguide with the mode conversion, the tapered portions are so designed as to be prevented from facing each other or existing on the same axis.

As in the first embodiment or the second embodiment, the ring laser is connected to the drive circuit and the signal processing circuit to oscillate the laser and generate a beat signal from the respective ring laser.

Figure 6:
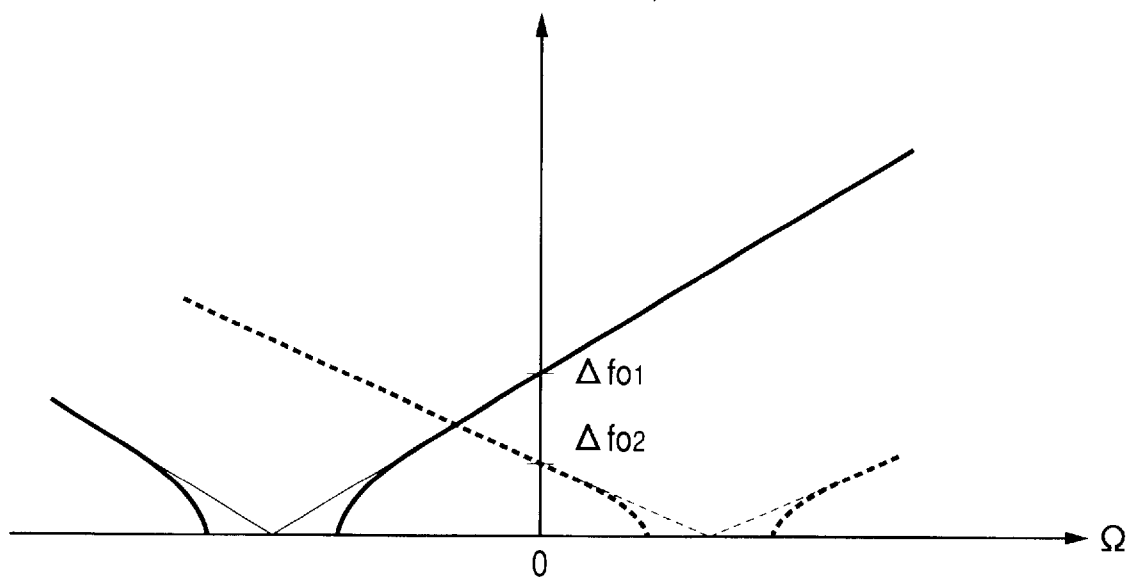
FIG. 6 is a graph showing a relationship of the frequency and the angular velocity of the signals obtained from the respective ring lasers in accordance with a third embodiment of the present invention.

Since the circumferential lengths and surrounding areas of those two ring sensors are different from each other, a relationship of the frequency and the angular velocity of the signals obtained from the respective ring lasers is shown in FIG. 6. The beat frequency in the stationary state becomes $\Delta f_{01}$ with respect to the ring resonator semiconductor laser 51 and $\Delta f_{02}$ with respect to the ring resonator semiconductor laser 52 depending on the differences in the shape and size. Also, since the ratio of the element area to the circumferential length is different between the respective ring resonator semiconductor lasers, an inclination of the beat frequency $\Delta f$ with respect to the angular frequency $\Omega$ is different in each of the ring resonator semiconductor lasers. For example, in this embodiment, the circumferential length of the inner ring laser is set 0.707 times as long as the outer ring laser. As a result, since the surrounding area S becomes 0.5 times, the inclination of the beat frequency $\Delta f$ to $\Omega$ becomes 0.707 times from the expression (3).

Figure 7:
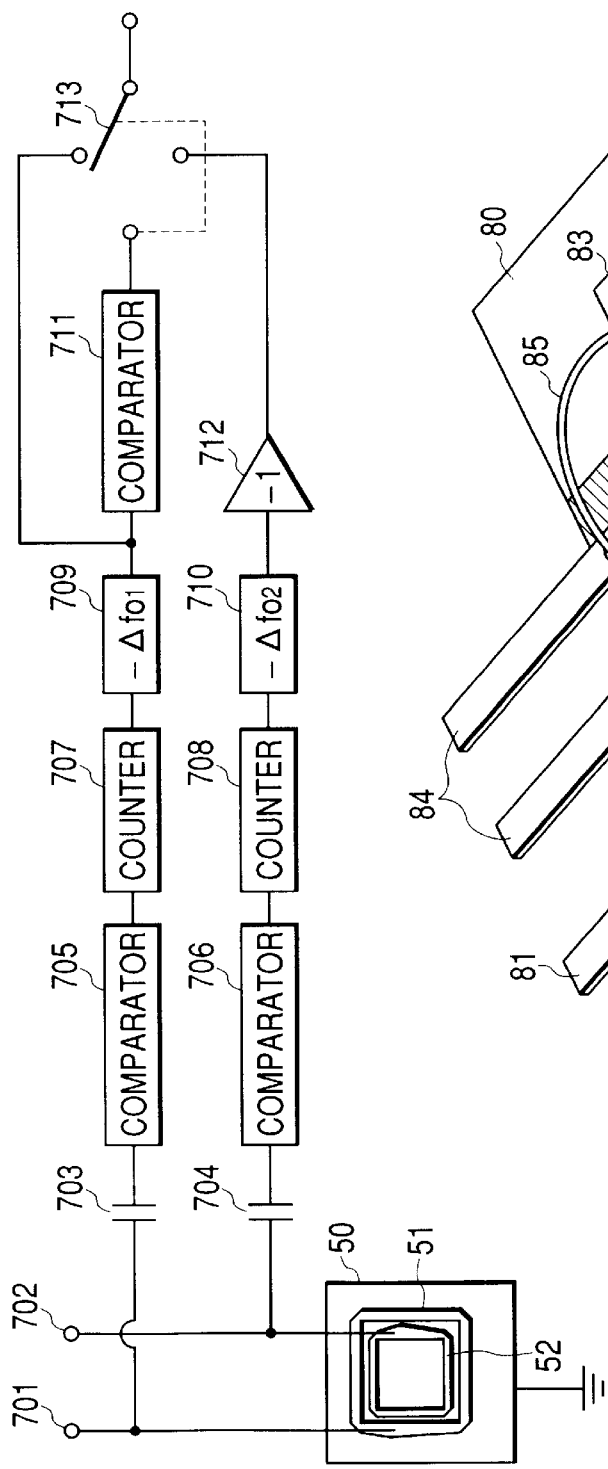
FIG. 7 is a diagram showing a ring laser gyro and a drive and signal processing circuit in accordance with a third embodiment of the present invention.

In this way, since the inner ring laser and the outer ring laser are different in characteristic from each other, the signal processing circuit is structured as shown in FIG. 7.

Referring to FIG. 7, reference numeral 50 denotes an optical gyro element according to the present invention, numerals 51 and 52 indicate ring resonator semiconductor laser elements, numerals 701 and 702 indicate drive current input terminals, numerals 703 and 704 indicate coupling capacitors, numerals 705, 706 and 711 indicate comparators, numerals 707 and 708 indicate counters, numerals 709 and 710 indicate offset circuits, numeral 712 indicates an inversion amplifier of a gain (−A), and numeral 713 indicates an output terminal. In the signal processing circuit, an angular velocity is detected as follows: A signal of the voltage fluctuation is taken in from the respective ring resonator semiconductor lasers through the capacitors 703 and 704, and the frequency signal is shaped into a pulse by the comparators 705 and 706. The number of pulses within a given period of time is counted by the counters 707 and 708. In the offset circuits 709 and 710, the amounts as large as the counts corresponding to the beat frequencies $\Delta f_{01}$ and $\Delta f_{02}$ when the respective ring lasers are stationary are subtracted from the number of pulses. The comparator 711 judges whether the output of the offset circuit 709 is positive or negative, and if the output is positive, the output is produced as an output 713 whereas if the output is negative, the output of the offset circuit 710 is inverted and amplified as an output 713. In this example, the gain (−A) is set to be (−1.414)=(−1/0.7070). In this manner, an output signal proportional to the angular velocity including the sign representative of the direction of rotation is obtained.

This embodiment is characterized in that in the use of the ring resonator laser having the same size as that in the first embodiment for the outer ring laser, the chip size of the gyro is the half of that in the first embodiment, thereby obtaining the elements of twice in number from the same wafer.

This embodiment exemplifies a circuit corresponding to that in the first embodiment as the signal processing circuit. Alternatively, it is possible that an f-V converting circuit corresponding to that of the second embodiment is designed taking the relationship between the angular velocity and the beat frequency shown in FIG. 6 into consideration to conduct signal processing. In this case, it is possible that the proportion coefficient of the f-V converting circuit is changed in accordance with the characteristics of the respective ring lasers to obtain an output signal proportional to the angular velocity and set the gain (−A) of the inversion amplification to be (−1).

(Fourth Embodiment)

Figure 8:
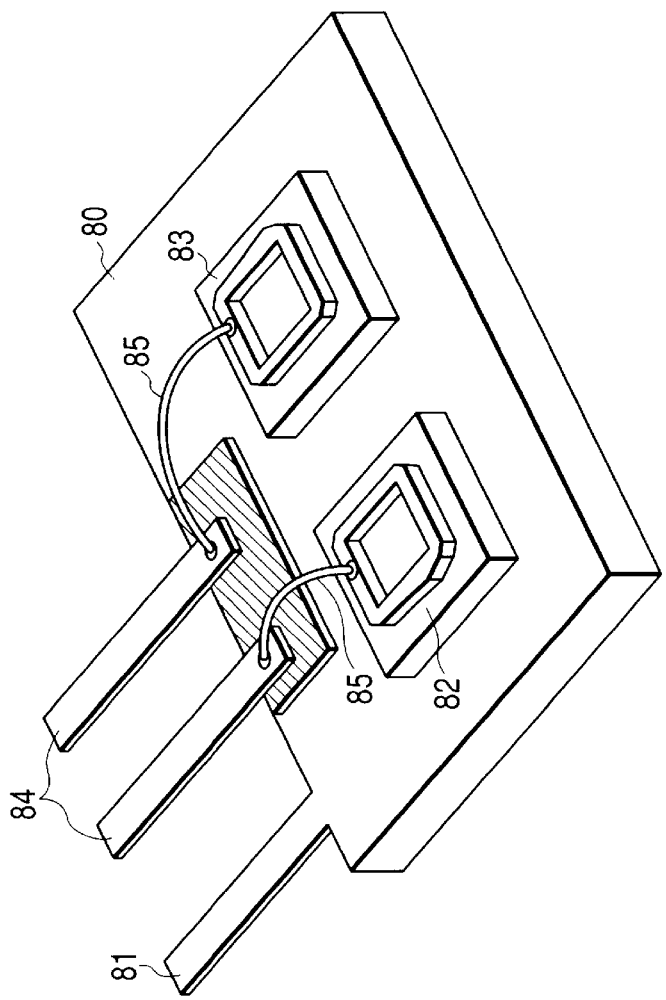
FIG. 8 is a perspective view showing another example of an optical gyro in accordance with a fourth embodiment of the present invention.

FIG. 8 is a perspective view showing another example of an optical gyro in accordance with the present invention in which a plurality of ring resonator laser diodes are disposed within one casing.

Referring to FIG. 8, reference numeral 80 denotes a stem used as a casing, numeral 81 indicates a common electrode connected to the stem 80, numerals 82 and 83 indicate ring resonator semiconductor laser elements different in tapered shape, 84 is electrodes corresponding to the respective elements of the ring resonator semiconductor lasers 82 and 83, numeral 85 indicates wires that connect the respective electrodes 84 to the ring resonator semiconductor lasers 82 and 83. In this example, the respective structures of the ring resonator semiconductor laser elements 82 and 83 different in tapered shape are identical with those of the ring resonator semiconductor laser elements shown in the first embodiment. Also, the respective tapered shapes will be described on the basis of the clockwise laser beam. The laser elements 82 and 83 are so designed as to have a first portion in which the width of the optical waveguide is gradually widened along the direction of propagating the light and a second portion in which the optical waveguide is gradually narrowed, and in the laser elements 82 and 83, the lengths of the first portion and the second portion are reversed.

In the above structure, the substrate sides of the respective ring resonator semiconductor laser elements 82 and 83 are employed as a common electrode, and those laser elements 82 and 83 are adhered to the stem 81 by soldering, individually, and the electrodes of the respective ring resonator semiconductor lasers 82 and 83 at the cap layer side are connected to the individual electrodes 84 by the respective wires 85.

As shown in FIG. 8, connection is made so that a current flows in the respective elements, and a change in a voltage between the electrodes of the respective ring resonator semiconductor lasers is detected while injecting a current. Since the injection of the current and the detection of the voltage are conducted by the same electrode, the circuit shown in FIG. 2 or FIG. 4 is employed.

The operation is identical with that in the first embodiment. That is, the respective ring resonator semiconductor lasers are driven with a constant current, and the frequencies of the clockwise light and the counterclockwise light fluctuate within the elements in accordance with the angular velocity Q, respectively. The voltage fluctuation between the terminals due to a difference in the frequency of the light is detected, thereby making it possible to measure the degree of the angular velocity including the sign through the signal processing described in the first and second embodiments.

The above description exemplifies the use of the stem as the casing; however, the casing of the present invention is not particularly limited if a plurality of ring resonator semiconductor lasers can be packaged in a hybrid manner, and for example, a case may be used as the casing.

In the above-described four embodiments, the ring resonator of the ring resonator semiconductor lasers is rectangular. However, a closed path such as a circumferential shape or a triangular shape may be applied thereto.

In the above-described four embodiments, the constant-current drive is conducted and the voltage fluctuation between the terminals in response to the angular velocity of the element is detected. As is apparent from the measurement principle that a change in the element impedance due to the angular velocity received by the element while the element is driven is detected, the element is driven with a constant voltage to detect a change in current, or a change in impedance is measured by another impedance measuring method, thereby making it possible to know the angular velocity.

As was described above, according to the first, the second and the third aspects of the present invention, there can be obtained an optical gyro which is capable of detecting the angular velocity of rotation and the direction of rotation.

The foregoing description of the preferred embodiments of the invention has been presented for purposes of illustration and description. It is not intended to be exhaustive or to limit the invention to the precise form disclosed, and modifications and variations are possible in light of the above teachings or may be acquired from practice of the invention. The embodiments were chosen and described in order to explain the principles of the invention and its practical application to enable one skilled in the art to utilize the invention in various embodiments and with various modifications as are suited to the particular use contemplated. It is intended that the scope of the invention be defined by the claims appended hereto, and their equivalents.

What is claimed is:

1. A ring laser gyro, comprising a plurality of ring resonator semiconductor lasers optically independent of each other, said plurality of ring resonator semiconductor lasers including at least one pair, wherein, for the at least one pair, changes in beat frequency increases and decreases are opposite to each other with respect to one directional rotation.

2. A method of processing a signal in a ring laser gyro as claimed in claim 1, in which the cycles of the impedance fluctuations between the terminals of said plurality of ring resonator semiconductor lasers are compared with the cycles of the respective impedance fluctuation in a stationary state, and an angular velocity and a direction of rotation are obtained on the basis of a signal from an element whose cycle is reduced.

3. The ring laser gyro as claimed in claim 1, wherein each of said plurality of ring resonator semiconductor lasers has a symmetrical tapered region.

4. The ring laser gyro as claimed in claim 1, wherein said ring resonator semiconductor lasers are disposed on a common plane of a semiconductor substrate surface.

5. The ring laser gyro as claimed in claim 1, wherein said ring resonator semiconductor lasers are disposed on a common plane out of a semiconductor substrate surface.

6. The ring laser gyro as claimed in claim 1, wherein said plurality of ring resonator semiconductor lasers are nested.

7. The ring laser gyro as claimed in claim 1, further comprising an absorber or a light shield body which prevents optical coupling between said plurality of ring resonator semiconductor lasers, wherein said absorber or said light shield body does not return a reflected light to said ring resonator semiconductor lasers.

8. The ring laser gyro as claimed in claim 1, wherein in two of said plurality of ring resonator semiconductor lasers, the shapes of the ring resonators have a mutual mirror image relationship.

9. A method of driving a ring laser gyro as claimed in claim 1, said method comprising the steps of:

driving the respective ring resonator semiconductor lasers with a constant current; and detecting a voltage fluctuation from said electric terminal.

10. A method of driving a ring laser gyro as claimed in claim 1, said method comprising the steps of:

driving the respective ring resonator semiconductor lasers with a constant current; and detecting a drive current fluctuation from said electric terminal.

11. A method of processing a signal in a ring laser gyro as claimed in claim 1, in which the cycles of the impedance fluctuations between the terminals of said plurality of ring resonator semiconductor lasers are compared with each other, and an angular velocity and a direction of rotation are obtained on the basis of a signal from an element whose cycle is shorter.

* * * * *

UNITED STATES PATENT AND TRADEMARK OFFICE
CERTIFICATE OF CORRECTION

PATENT NO. : 6,603,557 B2
DATED : August 5, 2003
INVENTOR(S) : Natsuhiko Mizutani It is certified that error appears in the above-identified patent and that said Letters Patent is hereby corrected as shown below:

Column 6,
Line 23, "$\rho_1 S_1 \tau_{12} S_2$" should read -- $\rho_1 S_1 - \tau_{12} S_2$ --.
Line 25, "$\rho_2 S_2 \tau_{21} S_1$" should read -- $\rho_2 S_2 - \tau_{21} S_1$ --.

Signed and Sealed this

Eleventh Day of November, 2003

JAMES E. ROGAN
*Director of the United States Patent and Trademark Office*